United States Patent [19]

Scholl

[11] Patent Number: 4,590,501

[45] Date of Patent: May 20, 1986

[54] EDGE-EMITTING LIGHT EMITTING DIODE

[75] Inventor: Frederick W. Scholl, Riverdale, N.Y.

[73] Assignee: Codenoll Technology Corporation, Yonkers, N.Y.

[21] Appl. No.: 532,731

[22] Filed: Sep. 15, 1983

[51] Int. Cl.$^4$ ............................................. H01L 33/00
[52] U.S. Cl. ......................................... 357/17; 357/7
[58] Field of Search ...................................... 357/7, 17

[56] References Cited

U.S. PATENT DOCUMENTS

| | | | |
|---|---|---|---|
| 3,456,209 | 7/1969 | Diemer | 331/94.5 |
| 3,938,172 | 2/1976 | Lockwood | 357/18 |
| 3,982,207 | 9/1976 | Dingle et al. | 331/94.5 H |

Primary Examiner—William L. Sikes
Assistant Examiner—Robert E. Wise
Attorney, Agent, or Firm—Pennie & Edmonds

[57] ABSTRACT

An edge-emitting LED in which light produced in the active layer optically tunnels out of the active layer through a thin confining layer into a single guide layer which is composed of a material which does not absorb light energy. The guide and active layers are constructed so that they are surrounded by layers of lower index of refraction so that an optical wave guide is formed. To minimize light losses by absorption, the non-absorbing guide layer is preferably much thicker than the active and confining layers so that light produced in the active layer travels primarily in the non-absorbing guide layer before it leaves the device at the exit facet of the LED.

27 Claims, 2 Drawing Figures

EDGE-EMITTING LIGHT EMITTING DIODE

BACKGROUND OF THE INVENTION

The present invention relates to a high efficiency semiconductor light emitting diode (LED) of the edge emitting type with one optically transparent confinement layer for use in high speed fiber optical communications.

The two types of semiconductor LED's most often used in fiber optical communication systems are the surface etched well emitter (Burrus type) and the edge-emitter. In the surface emitter, light is emitted from the surface of a planar LED structure along a path that is perpendicular to the p-n junction plane of the device. An optical fiber is aligned with this path to receive the emitted light. A well is etched into the top of the structure to enable the fiber to be as close as possible to the light emitting active region of the device.

The structure of the edge-emitter is very similar to that of a double heterojunction semiconductor laser. In the edge-emitter, the device is composed of layers of semiconductor material doped so that a p-n junction plane is formed. When the junction is forward biased, injected carriers (electrons and holes) recombine in the active layer and light is generated. The light is emitted from an edge of the device along a path which is parallel to the junction plane of the active layer. An optical fiber is aligned with this path at the edge of the device where the light is emitted.

Edge-emitters are potentially cheaper to fabricate and easier to package than surface emitters; however, the total optical power output of an edge-emitter is typically a fraction of that from comparable surface emitters. This lower output power level is caused by the reabsorption of light within the active region of the device. In one type of conventional edge emitting LED, the active layer is surrounded by two carrier confining layers. See *Semiconductor Devices for Optical Communication*, ed. H. Kressel, p. 38. These confining layers are relatively thick (on the order of 1.50 μm), thereby confining not only the excess injected carriers, but also spontaneously emitted photons generated during recombination. Photons cannot escape from the active layer in this structure, because they are totally internally reflected at the dielectric interface between the active layer and the confining layers. The photons are therefore trapped in the active layer before they eventually leave the device at the exit facet. Because the material composing the active layer is energy absorbing, device efficiency is relatively low.

An improved structure was proposed by Y. Horikoshi, et al. in Japanese Journal of Applied Physics, 15, 485 (1976) in which a guide layer was incorporated. This device provides a low absorption path by which photons can exit the LED chip, but carrier confinement provided by the optical guide layer is not adequate. As a result device internal quantum efficiency is lowered and device temperature sensitivity (i.e., drop in output power with increasing junction temperature) is increased.

SUMMARY OF THE INVENTION

This invention discloses a new structure for a high efficiency edge-emitting LED in which the light produced in an active layer of the device optically tunnels out of the active layer through a thin confining layer into a single guide layer. The guide and active layers are constructed so that they are surrounded by layers of lower index of refraction. In this way, light produced in the active layer is confined within the active and guide layers by total internal reflection. To improve the power output and therefore the efficiency of the device, the guide layer is constructed of material that does not absorb light energy and is thicker than the active and confining layers. Additionally, the confining layer is constructed so that it is thin enough for photons to tunnel through but has a composition and thickness such that carriers will be confined within the active layer of the device. As a result, light produced in the active layer tunnels through the confining layer and travels primarily in the single non-absorbing guide layer before it leaves the device at the exit facet of the LED.

BRIEF DESCRIPTION OF THE DRAWINGS

These and other objects, features, and advantages of the invention will be more readily apparent from the following description of a preferred embodiment of the invention in which.

DESCRIPTION OF THE PREFERRED EMBODIMENTS

Figure 1:
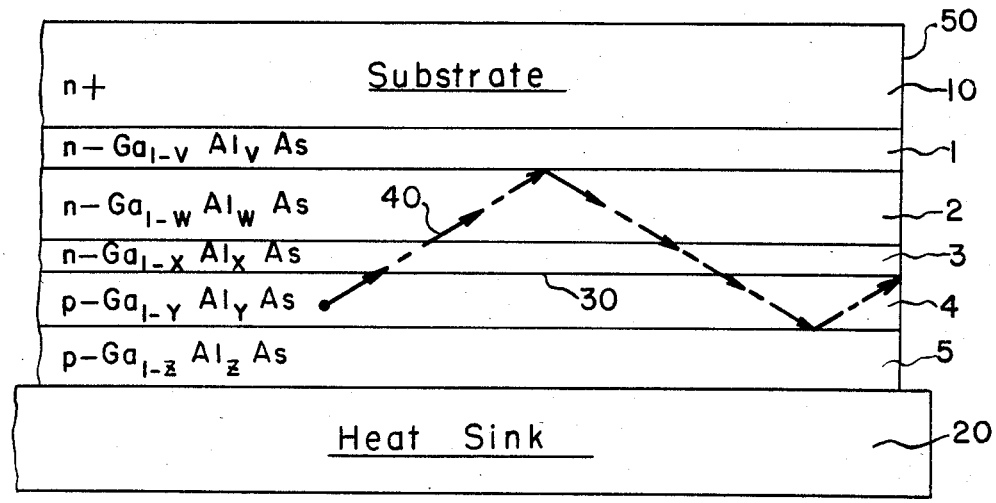
FIG. 1 is a cross-section of an embodiment of the improved edge-emitting light emitting diode of the present invention.

FIG. 1 is a cross-section of a portion of an LED of the present invention which typically is fabricated as a body of single crystalline semiconductor material in the form of a parallelepiped. The body is formed of five contiguous substantially planar layers 1, 2, 3, 4, and 5 extending between and perpendicular to the end surfaces of the body. These layers are formed on an n+substrate 10, and layer 5 is in contact with a heat sink 20. For convenience of illustration, the thicknesses of these layers are not drawn to scale.

Layers 1, 2, and 3 are of n-type conductivity and constitute a cladding layer, a guide layer and a top confining layer, respectively. Layers 4 and 5 are of p-type conductivity and constitute an active layer and bottom confining layer, respectively. These layers are preferably composed of the ternary compound GaAlAs such that the chemical composition of cladding layer 1 is n-type $Ga_{1-v}Al_vAs$, that of guide layer 2 is n-type $Ga_{1-w}Al_wAs$, that of top confining layer 3 is n-type $Ga_{1-x}Al_xAs$, that of active layer 4 is p-type $Ga_{1-y}Al_yAs$, and that of bottom confining layer 5 is p-type $Ga_{1-z}Al_zAs$, where v, w, x, y, and z are numbers greater than 0 but less than 1. A p-n junction 30 is formed between active layer 4 and top confining layer 3.

When p-n junction 30 is forward biased with a DC voltage (not shown), carriers (electrons and holes) are injected into and contained within active layer 4, and light is generated when oppositely charged carriers recombine. The edge-emitting LED typically has a spontaneous emission spectral line width of about 400 Å, while the output light is illustratively in the infrared range with a wavelength equal to 0.83 μm. corresponding to 1.49 eV.

The layers are formed so that the index of refraction of cladding layer 1 is less than that of guide layer 2 and so that the index of refraction of bottom confining layer 5 is less than that of active layer 4. These differences in the indices of refraction confine the light generated within guide layer 2, top confining layer 3, and active layer 4, creating an optical cavity or waveguide for the generated light. The relative values of the index of refraction of each layer may be achieved by varying the relative concentrations of gallium and aluminum, because as is described in S. M. Sze, *Physics of Semiconductor Devices*, p. 715 (1981), the index of refraction, n(x), of the ternary compound $Ga_{1-x}Al_xAs$ increases with increasing concentration of gallium according to the relation:

$$n(x) = 3.590 - 0.710x + 0.091x^2$$

Guide layer 2 is composed pf a $Ga_{1-w}Al_wAs$ material having a composition such that, at the frequcency of the light generated in active layer 4, the energy absorption coefficient of the material of guide layer 2 is so low that the material is substantially non-absorbing to such light. In order to achieve this property, the energy band gap of guide layer 2 must be about 0.0235 eV larger than the band gap of active layer 4. This difference corresponds to about 1 kT at room temperature, where k is Boltzman's constant and T is the temperature of the device. As is described in S. M. Sze, *Physics of Semiconductor Devices*, p. 713 (1981), the band gap, Eg(x), of the ternary compound $Ga_{1-x}Al_xAs$ increases with increasing concentration of aluminum according to the relation (which is valid for $0 < x < 0.35$):

$$E_g(x) = 1.424 + 1.247x \ (eV)$$

From this relation, a band gap differential between guide layer 2 and active layer 4 of 0.0235 eV corresponds to a difference in aluminum (and thus gallium) concentration $\Delta x$ in the ternary compound $Ga_{1-x}Al_xAs$ of approximately $\Delta x = 0.02$. Thus the aluminum concentration of guide layer 2 must be at least 0.02 greater than that of active layer 4. As a practical matter, the band gap difference between guide layer 2 and active layer 4 is not likely to be greater than 0.75 eV, corresponding to a guide layer of AlAs=2.17 eV) and an active layer of GaAs (Eg=1.42). As detailed below, guide layer 2 is preferably much thicker than confining layer 3 and active layer 4 and may, for example, be on the order of 10 μm.

Top confining layer 3 is made to be thin enough that spontaneously emitted photons generated in active layer 4 can optically tunnel through top confining layer 3 into the optically non-absorbing material of guide layer 2. Illustratively, the thickness of top confining layer 3 may be between 0.05 and 0.10 μm.

At the same time, the composition of confining layer 3 must be such that carrier recombination is adequately confined to active layer 4. To do this, the band gap difference between the active 4 and the adjacent layer must be at least about 4 kT, where k is Boltzmann's constant and T is the temperature of the device. Thus, at ambient temperatures, the band gap difference must be at least 0.10 eV. To achieve a 0.10 eV band gap difference between layers 3 and 4, the concentrations of gallium and aluminum in top confining layer 3 must be appreciably different from those in active layer 4. While the LED structure disclosed could be fabricated without top confining layer 3, poor performance will result since the energy band gap difference between guide layer 2 and active layer 4 is only equal to 0.0235 eV = 1 KT.

Active layer 4 must be thick enough to provide a region in which enough oppositely charged carriers can recombine. Typically, a thickness of the order of about 0.5 μm. is sufficient.

The path of a typical light ray 40 is shown in the device of FIG. 1. When light reaches the junction between cladding layer 1 and guide layer 2, the difference in the index of refraction of the layers causes the light to be reflected back through guide layer 2 toward active layer 4. Similarly, when the light reaches the junction between active layer 4 and bottom confining layer 5, the difference in the index of refraction of the layers causes the light to be reflected back through active layer 4 toward guide layer 2. These reflections continue causing the light ray to propagate in a direction parallel to the plane of layers 1 through 5 until the light ray reaches an exit facet 50 of the device. Typically, only one facet of the device is an exit facet and the other facets are coated with a reflective coating so as to maximize light emission from the exit facet.

Because the thickness of non-absorbing guide layer 2 is greater than the thickness of confining layer 3 and active layer 4, light produced in active layer 4 travels primarily in non-absorbing guide layer 2 and the absorption of light is accordingly reduced. As will be apparent from FIG. 1, increasing the thickness of guide layer 2 increases the portion of light ray path 40 that lies in guide layer 2 and therefore reduces the amount of light absorbed by the device. At the same time, there is a trade-off involved in selecting the exact relationship between the thickness of guide layer 2 and that of active layer 4 because the cost of fabricating the device increases with the thickness of guide layer 2. Thus, the thicker guide layer 2 is in relation to active layer 4, the higher the efficiency and the higher the cost. Typically the guide layer thickness is selected so that photons generated by active layer 4 traverse confining layer 3 only once, as they leave layer 4. Rays of interest are those lying within the numerical aperture (NA) of the collecting optics. This includes fiber optics or conventional lens systems. The numerical aperture is a measure of the cone of light rays which will propagate through the material without leaking. If the device length is L, the thickness of the guide layer 2 is W and the index of refraction of this layer is $n_2$ then if $$W \geq \frac{L/2}{[(n_2/NA)^2 - 1]^{\frac{1}{2}}}$$

rays leaving the active layer 4 will exit the device before renetering layer 4.

As an example of the device shown in FIG. 1, cladding layer 1 is n-type $Ga_{0.71}Al_{0.29}As$ of thickness 2.0 μm.; guide layer 2 is n-type $Ga_{0.93}Al_{0.07}As$ of thickness 10.0 μm.; top confining layer 3 is n-type $Ga_{0.75}Al_{0.25}As$ of thickness 0.1 μm.; active layer 4 is p-type $Ga_{0.95}Al_{0.05}As$ of thickness 0.5 μm.; and bottom confining layer 5 is $p^+$-type $Ga_{0.75}Al_{0.25}As$ of thickness 1.0 μm. Cladding layer 1 is covered by a substrate 10 of $n^+$-type material of thickness 75.0 μm., and the parallelpiped device is bonded on the exposed surface of bottom confining layer 5 to a suitable heat sink 20. The infrared radiation is generated in active layer 4, and, after one or more internal reflections, leaves the device at the exit facet from guide layer 2 and active layer 4.

In another example, guide layer 2 and active layer 4 are composed of a compound with the chemical formula $Ga_{0.95}Al_{0.05}As$, and top confining layer 3 is composed of a compound with the chemical formula $Ga_{0.75}Al_{0.25}As$.

Figure 2:
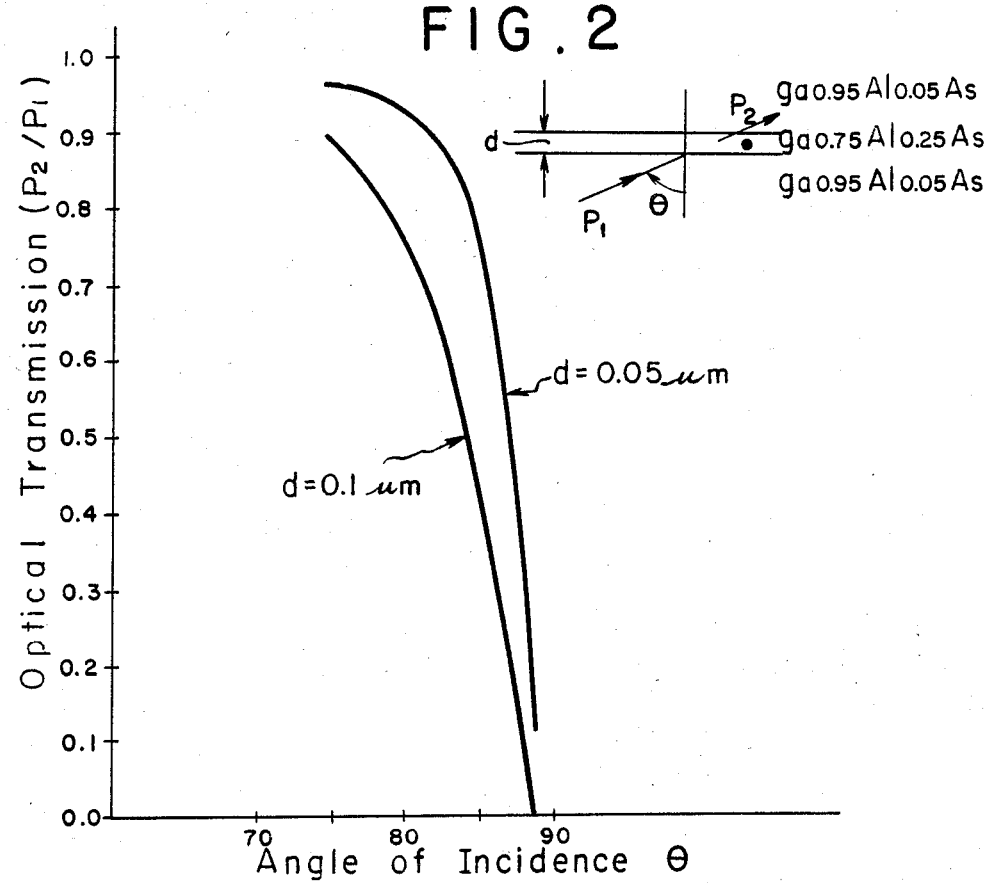
FIG. 2 is a graphical representation of the optical transmission through a heterojunction barrier made according to the invention.

FIG. 2 is a graphical representation of the optical transmission through top confining layer 3 of this example as a function of the angle of incidence of a representative light ray for the disclosed edge-emitting LED device. Data are given for thicknesses of top confining layer 3 equal to 0.05 μm. and 0.1 μm., and for angles of incidence between 70° and 90°. As can be seen, optical transmission is very high for these thicknesses at angles of incidence of primary interest.

In contrast, for a conventional edge emitting LED with a thick confining layer, optical transmission would be zero for all rays such that $\sin\theta \geq n_3/n_4$. Thus in a conventional edge-emitting LED having an active layer and a confining layer with the compositions shown in FIG. 2, rays with $\theta \geq 74°$ are trapped within active layer 4.

Different fabrication techniques may be used to form the structures shown. For example, Liquid Phase Epitaxy (LPE) or Vapor Phase Epitaxy (VPE) techniques, such as Molecular Beam Epitaxy (MBE) or Metalorganic Chemical Vapor Deposition (MOCVD), may be employed.

Although guide layer 2 and active layer 4 of the foregoing examples are composed of material with constant index of refraction, these layers may also be composed of material with a graded index of refraction. The index of refraction should be graded so that it is greatest at the surfaces making contact with the confining layer 3.

While the invention has been described in conjunction with specific embodiments, it is evident that numerous alternatives, modifications, and variations will be apparent to those skilled in the art in light of the foregoing description.

What is claimed is:

1. In a light emitting diode of the edge-emitting type comprising a plurality of contiguous semiconductor layers one of which forms an active layer with a p-n junction thereat and into which carriers are injected when a bias voltage is applied,
   means to establish a transverse optical cavity for supporting optical wave propagation in a direction parallel to said active layer when a voltage is applied across said junction with radiation being emitted from said device at an end surface thereof, said means comprising:
   a first layer of semiconductor material located within said optical cavity for confining carriers in said active layer,
   a second layer of semiconductor material comprising a material that absorbs relatively little of the energy of the photons that tunnel through said first layer, said second layer being located within said optical cavity so that said first layer lies between said active layer and said second layer and said second layer having a thickness that is greater than the thickness of said active layer and said first layer, and
   means surrounding said active layer, said first layer and said second layer and extending in a direction parallel to said active layer for confining the photons that tunnel through said first layer, said confining means comprising a semiconductor material having a refractive index lower than that of the material comprising said active and second layers,
   said first layer having a thickness that simultaneously maximizes the number of photons that tunnel through said first layer from said active layer into said second layer while confining carriers in said active layer.

2. The light emitting diode of claim 1 wherein said semiconductor layers comprise a ternary compound.

3. The light emitting diode of claim 2 wherein the ternary compound is GaAlAs and the relative concentrations of gallium and aluminum are varied in different layers to obtain the desired characteristics.

4. The light emitting diode of claim 1 wherein said second layer has a thickness at least ten times greater than that of said active layer.

5. The light emitting diode of claim 1 wherein said first layer has a thickness between 0.05 and 0.1 μm.

6. The light emitting diode of claim 1 wherein the energy band gap of said first layer is at least 0.10 eV greater than that of said active layer.

7. The light emitting diode of claim 1 wherein said second and active layers have graded indices of refraction such that the indices of refraction of each of said second and active layers are greatest where they contact the first layer.

8. The light emitting diode of claim 1 wherein said first layer has a thickness between 0.05 and 0.1 μm. and said second layer has a thickness that is at least ten times greater than that of said active layer.

9. The light emitting diode of claim 1 wherein the energy band gap of said second layer is at least 0.0235 eV greater than that of said active layer.

10. A light emitting diode of the edge-emitting type in which radiation is emitted from said diode at an end surface thereof, said diode comprising:
    a first layer of semiconductor material with a p-n junction thereat and into which carriers are injected when a voltage is applied across said junction,
    a second layer of semiconductor material contiguous with said first layer for confining carriers in said first layer,
    a third layer of semiconductor material comprising a material the absorbs relatively little of the energy of the electromagnetic radiation that tunnels through said second layer, said third layer being contiguous to said second layer and having a thickness that is greater than the thickness of said first and second layers, and
    fourth and fifth layers of semiconductor material surrounding said first, second and third layers and extending in a direction parallel to said first layer for confining the electromagnetic radiation that tunnels through said second layer within an optical cavity, said fourth and fifth layers being contiguous to said first and third layers, respectively and having a refractive index lower than that of the material comprising said first and third layers,
    said second layer having a thickness that simultaneously maximizes the amount of electromagnetic radiation produced in said first layer tunnelling through said second layer from said first layer into said third layer while confining carriers in said first layer.

11. The light emitting diode of claim 10 wherein said semiconductor layers comprise a ternary compound.

12. The light emitting diode of claim 11 wherein the ternary compound is GaAlAs and the relative concentrations of gallium and aluminum are varied in different layers to obtain the desired characteristics.

13. The light emitting diode of claim 10 wherein said second layer has a thickness between 0.05 and 0.1 μm and said third layer has a thickness at least ten times greater than said first layer.

14. The light emitting diode of claim 10 wherein the energy band gap of said second layer is at least 0.10 eV greater than that of said first layer and the energy band gap difference between said first and third layers is such that the electromagnetic radiation that is produced in said first layer and tunnels through said second layer is in the infrared region of the optical spectrum.

15. The light emitting diode of claim 14 wherein the energy band gap of said third layer is at least 0.0235 eV greater than that of said first layer.

16. In a light emitting diode of the edge-emitting type wherein optical wave propagation is in a direction parallel to a plurality of contiguous semiconductor layers comprising said device, one of said layers forming an active layer and having an active region with a p-n junction thereat,
    means to establish a transverse optical cavity for supporting optical wave propagation in a direction parallel to said active layer when a voltage is applied across said junction with radiation being emitted from said device at an end surface thereof transverse to the planar extent of said layers, said means comprising:
    a carrier confinement means comprising a confining layer of semiconductor material so that carriers are confined in said active layer, said confining layer being located within said optical cavity,
    a guide layer of semiconductor material comprising a material that does not absorb the energy of the radiation produced in said active layer, said guide layer being located within said optical cavity so that said confining layer lies between said active layer and said guide layer and having a thickness that is greater than that of said active layer and said confining layer, and
    wave guide confinement means surrounding said active layer, said confining layer and said guide layer and extending in a direction parallel to said active layer, said wave guide confinement means comprising a semiconductor material having a refractive index lower than that of the material comprising said active and guide layers,
    said confining layer having a thickness that simultaneously maximizes the amount of radiation produced in said active layer tunnelling through said confining layer from said active layer into said guide layer while confining carriers in said active layer.

17. The light emitting diode of claim 16 wherein said semiconductor layers are composed of the ternary compound GaAlAs where the relative concentrations of gallium and aluminum are varied in different layers to obtain the desired characteristics.

18. The light emitting diode of claim 16 wherein said guide layer has a thickness equal to at least ten times greater than that of said active layer.

19. The light emitting diode of claim 16 wherein said confining layer has a thickness between 0.05 and 0.1 μm.

20. The light emitting diode of claim 16 wherein the energy band gap of said confining layer is at least 0.10 eV greater than that of said active layer.

21. The light emitting diode of claim 16 wherein the energy band gap of said guide layer is at least 0.0235 eV greater than that of said active layer.

22. The light emitting diode of claim 16 wherein said confining layer has a thickness between 0.05 and 0.1 μm. and said guide layer has a thickness that is at least ten times greater than that of said active layer.

23. In a light emitting diode of the edge-emitting type comprising a plurality of contiguous semiconductor layers one of which forms an active layer with a p-n junction thereat and into which carriers are injected when a bias voltage is applied,
    means to establish a transverse optical cavity for supporting optical wave propagation in a direction parallel to said active layer when a voltage is applied across said junction with radiation being emitted from said device at an end surface thereof, said means comprising:
    a first layer of semiconductor material located within said optical cavity for confining carriers in said active layer, said first layer having a thickness between 0.05 and 0.1 μm and an energy band gap at least 0.10 eV greater than that of said active layer,
    a second layer of semiconductor material comprising a material that absorbs relatively little of the energy of the photons that tunnel through said first layer, said second layer being located within said optical cavity so that said first layer lies between said active layer and said second layer and said second layer having a thickness that is at least ten times greater than the thickness of said active layer and said first layer and an energy band gap at least 0.0235 eV greater than that of said active layer, and
    means surrounding said active layer, said first layer and said second layer and extending in a direction parallel to said active layer for confining the photons that tunnel through said first layer, said confining means comprising a semiconductor material having a refractive index lower than that of the material comprising said active and second layers.

24. In a light emitting diode of the edge-emitting type comprising a plurality of contiguous semiconductor layers one of which forms an active layer with a p-n junction thereat and into which carriers are injected when a bias voltage is applied,
    means to establish a transverse optical cavity for supporting optical wave propagation in a direction parallel to said active layer when a voltage is applied across said junction with radiation being emitted from said device at an end surface thereof, said means comprising:
    a first layer of semiconductor material located within said optical cavity for confining carriers in said active layer, said first layer having a thickness between 0.05 and 0.1 μm.
    a second layer of semiconductor material comprising a material that absorbs relatively little of the energy of the photons that tunnel through said first layer, said second layer being located within said optical cavity so that said first layer lies between said active layer and said second layer and said second layer having a thickness that is greater than the thickness of said active layer and said first layer, and
    means surrounding said active layer, said first layer and said second layer and extending in a direction parallel to said active layer for confining the photons that tunnel through said first layer, said confining means comprising a semiconductor material having a refractive index lower than that of the material comprising said active and second layers, said first layer having an energy band gap that is sufficiently greater than that of the active layer to confine carriers in said active layer.

25. The light emitting diode of claim 24 wherein said semiconductor layers comprise a ternary compound.

26. The light emitting diode of claim 25 wherein the ternary compound is GaAlAs and the relative concentrations of gallium and aluminum are varied in different layers to obtain the desired characteristics.

27. The light emitting diode of claim 24 wherein said second and active layers have graded indices of refraction such that the indices of refraction of each of said second and active layers are greatest where they contact said first layer.

* * * * *